(12) United States Patent
Tanaka et al.

(10) Patent No.: US 7,514,298 B2
(45) Date of Patent: Apr. 7, 2009

(54) PRINTED WIRING BOARD FOR MOUNTING SEMICONDUCTOR

(75) Inventors: Akinori Tanaka, Toyota (JP); Toru Yamada, Toyota (JP); Tadashi Ando, Toyota (JP)

(73) Assignee: Japan Circuit Industrial Co., Ltd., Aichi-ken (JP)

( * ) Notice: Subject to any disclaimer, the term of this patent is extended or adjusted under 35 U.S.C. 154(b) by 0 days.

(21) Appl. No.: 11/700,821

(22) Filed: Feb. 1, 2007

(65) Prior Publication Data

US 2007/0173135 A1  Jul. 26, 2007

Related U.S. Application Data

(62) Division of application No. 10/869,857, filed on Jun. 18, 2004, now abandoned.

(30) Foreign Application Priority Data

Jun. 20, 2003 (JP) ............... 2003-175723
Feb. 13, 2004 (JP) ............... 2004-036225

(51) Int. Cl.
*H01L 21/58* (2006.01)
(52) U.S. Cl. .................. 438/125; 438/640; 257/692; 257/698; 257/700; 257/774; 257/786
(58) Field of Classification Search .......... 438/639, 438/640, 612, 613, 125; 257/692, 698, 700, 257/774, 786
See application file for complete search history.

(56) References Cited

U.S. PATENT DOCUMENTS

| 3,787,252 | A | 1/1974 | Filippazzi et al. |
|---|---|---|---|
| 5,065,228 | A | 11/1991 | Foster et al. |
| 5,229,647 | A | 7/1993 | Gnadinger |
| 5,662,987 | A | 9/1997 | Mizumoto et al. |
| 6,013,948 | A | 1/2000 | Akram et al. |
| 6,284,353 | B1 | 9/2001 | Takada et al. |
| 6,340,841 | B2 | 1/2002 | Iijima et al. |
| 6,699,787 | B2 * | 3/2004 | Mashino et al. ............. 438/667 |
| 6,753,600 | B1 | 6/2004 | Ho |
| 6,828,510 | B1 | 12/2004 | Asai et al. |
| 6,835,294 | B2 | 12/2004 | Tsuchida et al. |
| 6,916,873 | B2 | 7/2005 | Yamamoto et al. |
| 2002/0004982 | A1 | 1/2002 | Haze et al. |
| 2002/0180027 | A1 | 12/2002 | Yamaguchi et al. |
| 2002/0185311 | A1 | 12/2002 | Cohn |
| 2003/0178388 | A1 | 9/2003 | Phillips |
| 2005/0035464 | A1 * | 2/2005 | Ho et al. ..................... 257/778 |

* cited by examiner

*Primary Examiner*—M. Wilczewski
(74) *Attorney, Agent, or Firm*—Wenderoth, Lind & Ponack, L.L.P.

(57) ABSTRACT

A printed wiring board for mounting a semiconductor, which printed wiring board has a taper-shaped through hole connecting an upper surface circuit and a lower surface circuit, and/or an internal layer circuit, the taper-shaped through hole being obtained by plating an inner wall surface and a small-diameter side end of a taper-shaped penetration hole with a metal to plate the inner wall surface and seal the small-diameter side end, wherein a ball pad or a bump pad is formed at least a small-diameter side end of the taper-shaped through hole.

4 Claims, 8 Drawing Sheets

PRINTED WIRING BOARD FOR MOUNTING SEMICONDUCTOR

This application is a divisional of U.S. application Ser. No. 10/869,857, filed Jun. 18, 2004 now abandoned.

BACKGROUND OF THE INVENTION

1. Field of the Invention

The present invention relates to a printed wiring board suitable for use in electronic equipment, electrical equipment, a computer, telecommunications equipment, etc. More specifically, it relates to a printed wiring board used for a pin grid array, a ball grid array, a chip size package, MCM, etc., which mounts a semiconductor.

2. Description of the Related Art

A high density of a printed wiring board is required in accordance with high integration of a semiconductor. Particularly, not only an increase in the number of layers and a fine line of a wiring pattern but also a decrease in the size of a plated penetrating through hole are rapidly advancing with regard to a semiconductor-mounting printed wiring board used in the above fields. The decrease in the through hole size can contribute an improvement in the density of a wiring pattern, since it can decrease the size of a pad for the through hole. However, a through hole land and a ball pad and/or a bump pad are disposed separately, so that there is a limit to the density increase. Further, with regard to a conventional cylindrical through hole, the hole is filled with an insulating resin or an electrically conductive paste for preventing an influence on parts to be mounted. However, there have been arising some problems such as sink or falling-off of the filling resin and moisture permeation. For solving the above problems, the present inventors have proposed a printed wiring board having a taper-shaped through hole obtained by plating an internal wall surface and a small-diameter side end of a taper-shaped penetration hole to plate the internal wall surface and seal the small-diameter side end (JP-A-2000-77568, JP-A-2000-77809).

However, the above printed wiring board does not overcome the problem of high density of a wiring pattern.

Generally, a ball pad or a bump pad is disposed separately from a through hole land, and these are connected to each other. When the through hole land can be directly used as a ball pad or a bump pad, a further high density can be actualized. However, for utilizing a through hole part as a ball pad or a bump pad, it is required to carry out lid-plating after filling the through hole with a resin. The above process of resin-filling and lid-plating requires a number of steps and, in addition, the thickness of copper on an external layer becomes large, so that it is difficult to make a fine wiring. Further, with regard to a general through hole, it is difficult to fill it by plating.

In the present fields, there is a tendency to a narrow pitch or a multi-row arrangement of ball pads or bump pads for achieving a further high density. In this case, it is required to arrange a number of wirings between through hole lands. However, the space between through holes is limited so that it is impossible to secure a necessary number of wirings.

SUMMARY OF THE INVENTION

It is an object of the present invention to provide a high-densified printed wiring board for mounting a semiconductor.

The present invention provides a printed wiring board for mounting a semiconductor, which printed wiring board has a taper-shaped through hole connecting an upper surface circuit and a lower surface circuit, and/or an internal layer circuit, the taper-shaped through hole being obtained by plating an inner wall surface and a small-diameter side end of a taper-shaped penetration hole (i.e., passage) with a metal to plate the inner wall surface and seal the small-diameter side end, wherein a ball pad or a bump pad is formed at at least a small-diameter side end of the taper-shaped through hole.

The present invention provides a printed wiring board for mounting a semiconductor, comprising a plurality of taper-shaped through holes to facilitate electrical conduction between an upper surface circuit and a lower surface circuit, and ball pads and/or bump pads respectively provided on upper portions and lower portions of the taper-shaped through holes, the taper-shaped through holes being obtained by plating internal wall surfaces and small-diameter side ends of taper-shaped penetration holes (i.e., passages) with a metal to plate the internal wall surfaces and seal the small-diameter side ends, wherein the center position (axis) of at least one through hole of the through holes is one-sided (offset), and within the ball pad and/or the bump pad corresponding to the at least one through hole, or within a peripheral area which is 100 μm or less outside from the edge of the ball pad and/or the bump pad corresponding to the at least one through hole.

DETAILED DESCRIPTION OF THE INVENTION

The present invention 1 will be explained with reference to FIG. 1. An insulating substrate 1 (FIG. 1 (A)) used in the printed wiring board of the present invention is a laminate or a glass-fiber-containing or glass-fabric-containing laminate of an epoxy resin, a cyanate resin, a bismaleimide triazine resin, a polyimide resin, a polyphenylene ether resin, etc. A film-like insulating material can be also used. The insulating material is not specially limited so long as it is an insulating material which is used as a printed wiring board or a semiconductor package. A double-side board or a multilayer board can also be used. As an insulating substrate 1, there may be also used a substrate having conductive layers 2 (FIG. 1 (A)), such as copper foils, on upper and lower surfaces. These materials will be generically called "substrate, etc." hereinafter.

Figure 1:
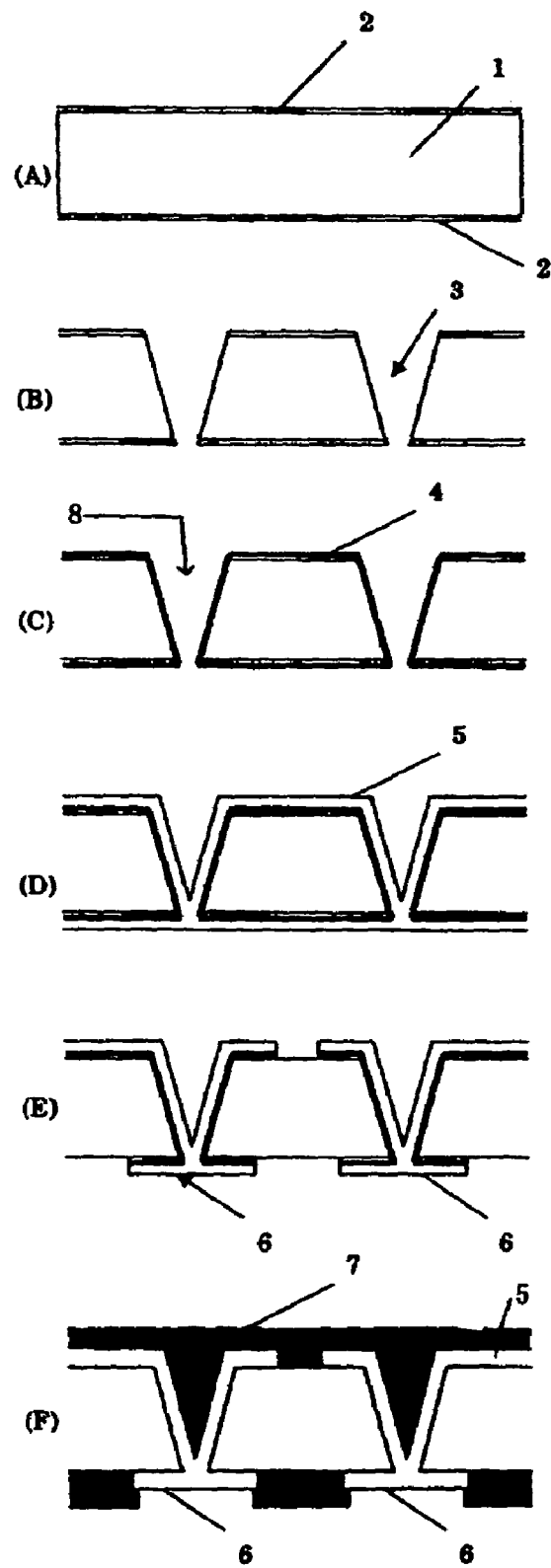
FIG. 1 is an explanatory drawing showing a printed wiring board of the present invention, in which ball pads are formed at small-diameter side ends of taper-shaped through holes.

A taper-shaped penetration hole, or passage 3 (FIG. 1 (B)) is made through the upper and lower surfaces of an insulating substrate (1) at a desired position of the substrate, and the upper and lower surfaces of the insulating substrate are electrically conducted to each other by a panel plating method (electroless plating 4 and electroplating 5, etc.), to make a through hole 8 and simultaneously seal its small-diameter side end with a plating metal. Thereafter, patterns are formed on the upper and lower surfaces by a known subtractive method. In the formation of the patterns, a ball pad 6 (FIG. 1 (E)) is disposed on the taper-shaped through hole portion. Otherwise, patterns are formed by a pattern plating method (additive method, semi-additive method, etc.) and simultaneously the inside of the through hole is plated to electrically connect the upper surface and the lower surface and to plate and seal the small-diameter side end, whereby a ball pad or bump pad is disposed at the through hole portion.

The taper-shaped penetration hole is formed by preferably laser processing, more preferably UV-laser processing. When a general cylindrical penetration hole is made in a substrate, etc., with a UV laser, it can be made by overlapping small laser-processing spots, i.e. by trepanning processing, as disclosed in U.S. Pat. No. 5,593,606. On the other hand, the taper-shaped penetration hole of the present invention is made by similar trepanning. It is preferred that a laser energy and the number of shots are selected such that the processing progresses more in the central part of the penetration hole than in a marginal part of the penetration hole, as seen from the upper surface of the substrate, etc. It is preferred to dispose an entry sheet for laser processing or a backup sheet on an upper surface or a lower surface of the substrate, etc., during the processing in view of smooth progress of working. UV laser processing conditions differ depending upon the thickness of a material to be processed or the thickness of a metal conductor, while the processing is carried out by controlling the energy of one shot, positions of shots, the number of shots, the total energy, etc.

When a penetration hole is made in a copper-clad laminate with a carbon dioxide gas laser, the penetration hole is made by a method in which a copper foil in a position where the penetration hole is to be made is removed by etching and then the copper-clad laminate is processed by laser irradiation, a method in which a copper surface is treated by blackening treatment or etching treatment and then a laser is irradiated, or a method in which an entry sheet for laser processing is disposed and then a laser is irradiated. For making a taper-shaped penetration hole, it is required to control an irradiation energy, the number of pulses, the diameter of a mask, etc. For avoiding injuring a processing table, a backup sheet for laser processing may be disposed on a laser-outgoing side. A carbon dioxide gas laser and a UV laser may be used in combination in the laser processing. For example, the UV laser may be used for forming an opening of the small-diameter side end after carrying out processing with the carbon dioxide gas laser. As the entry sheet for laser processing or as the backup sheet for laser processing, there may be used an entry sheet or a backup sheet disclosed in JP-A-1999-346059A.

The diameter of the small-diameter side end of the taper-shaped penetration hole is preferably 5-70 μm. When the above diameter is smaller than 5 μm, it is difficult to continuously supply a plating solution into the inside of the hole on the small-diameter side in plating processing even when the plating solution is stirred or shaken. Further, even when the small-diameter side end can be sealed with a plating metal, the cross-section area, at the small-diameter part, of a plating layer for electrically connecting an upper conductor and a lower conductor of the insulating substrate becomes small, so that connection reliability decreases. On the other hand, when the above diameter is larger than 70 μm, there occur problems in plating processing for panel plating that the small-diameter side end cannot be sealed or that it is difficult to form a pattern with high accuracy since the thickness of plating becomes too large. Moreover, in a pattern plating method, it is required to use a thick plating resist for increasing the thickness of plating in order to seal the small-diameter side end by plating, so that it is similarly difficult to form a pattern with high accuracy. The opening diameter of the small-diameter side end is more preferably 10 to 50 μm, further more preferably 15 to 40 μm. The diameter of a large-diameter side end is preferably 200 μm at maximum. When it is larger than 200 μm, the diameter of a land becomes large, which prevents densification. In addition, when plating for hole-filling is carried out, the plating takes a long time, which results in a cost increase. The diameter of the large-diameter side end is more preferably 150 μm or less, further more preferably 100 μm or less.

The plating processing can be carried out by a general method such as panel plating or pattern plating. The inside of the taper-shaped through hole may be filled and plated by concurrent use of pulse plating. The hole-filling plating of the taper-shaped through hole is suitable when the large-diameter side end of the taper-shaped through hole is used as a ball pad or a bump pad.

In the present invention, the inside of the taper-shaped through hole plated and sealed may be covered or filled with an insulating material. A coating composition which is generally called a solder resist can be used as the insulating material. Further, there can be used a thermosetting resin, a UV (ultraviolet) curable resin, a resin curable by UV and heat, etc. These resins may contain an inorganic filler component.

After forming patterns on both external surfaces, the solder resist is disposed on both the external surfaces. Generally, the solder resist is disposed such that no solder resist is placed at portions at which a bondfinger pad, a ball pad, a bump pad, a mold gate, etc., are formed. The above portions with no solder resist are properly treated by a surface-treatment such as electrolytic nickel/gold plating, electroless nickel/goldplating, organic rust prevention or a solder precoat, as required. Different surface-treatments between the upper surface and the lower surface can be carried out, as required. Further, a partially different treatment may be carried out as required.

Figure 2:
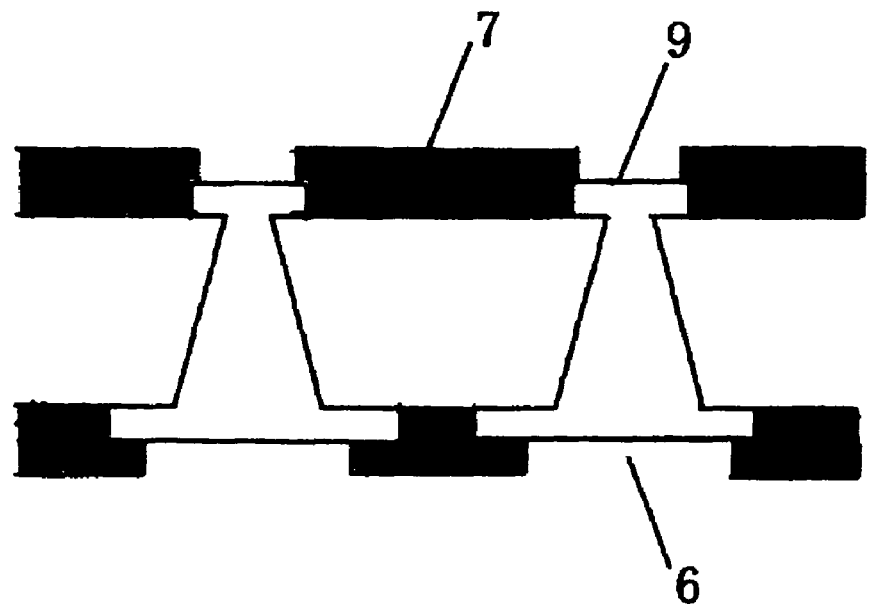
FIG. 2 is an explanatory drawing showing a printed wiring board of the present invention, in which taper-shaped through holes are filled by plating and bump pads are formed at small-diameter side ends and ball pads are formed at large-diameter side ends.
Figure 3:
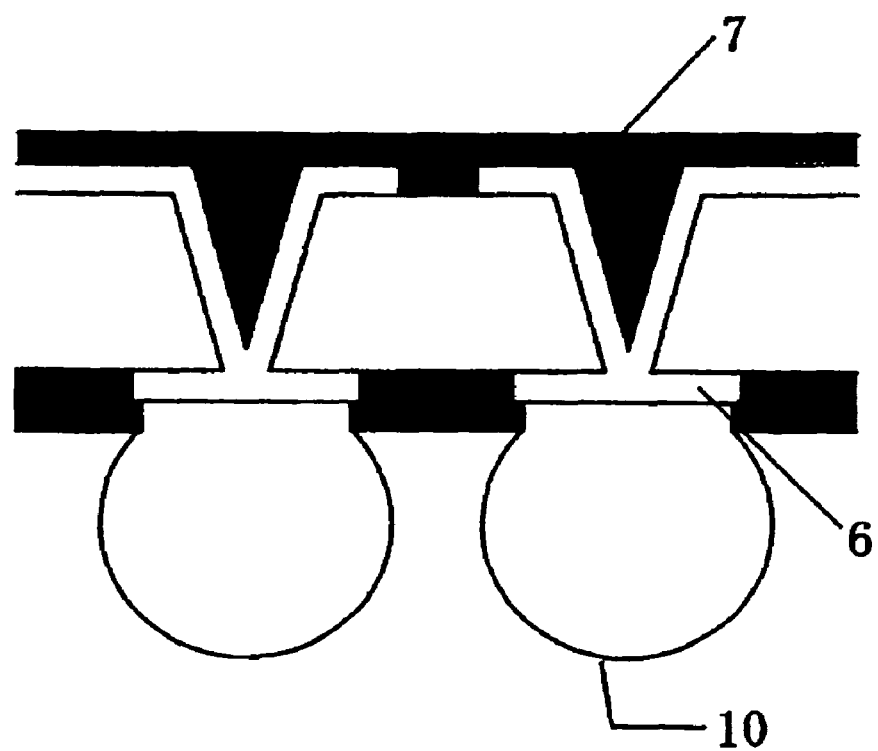
FIG. 3 is an explanatory drawing showing a printed wiring board of the present invention, in which taper-shaped through holes are filled with a solder resist and solder balls are mounted on small-diameter side ends.
Figure 4:
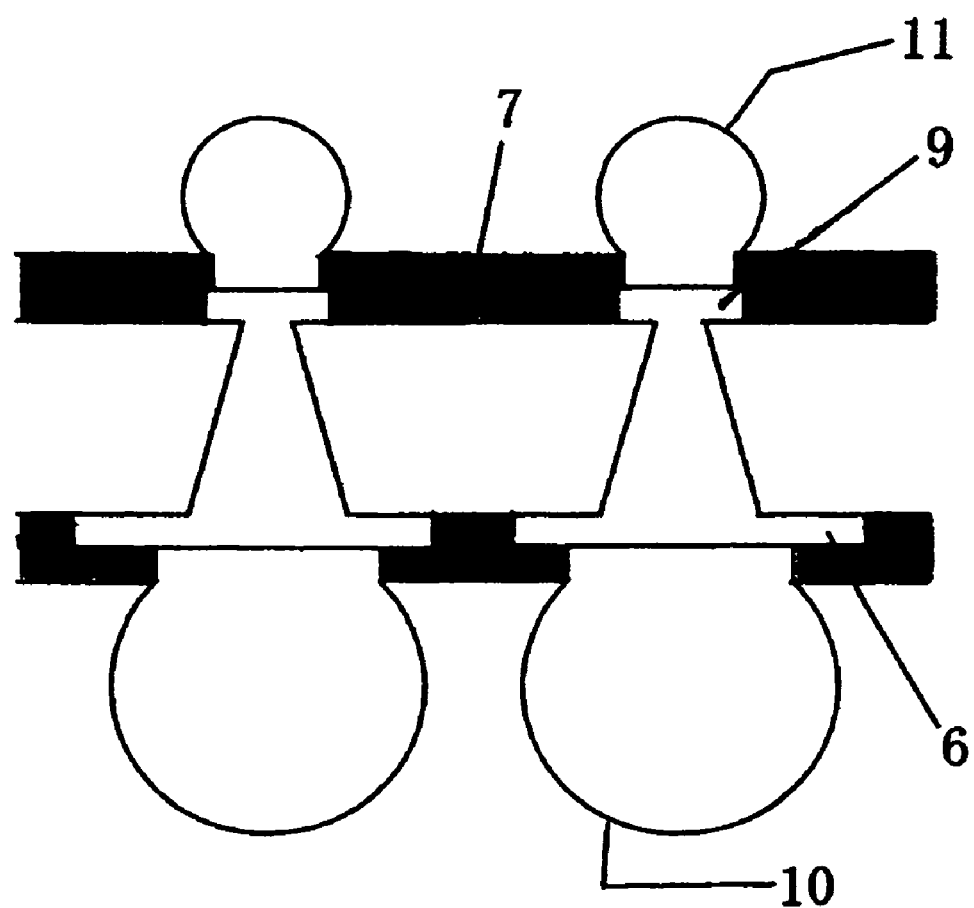
FIG. 4 is an explanatory drawing showing a printed wiring board of the present invention, in which pads are formed at both side ends of taper-shaped through holes filled by plating and solder precoats and solder balls are mounted.
Figure 5:
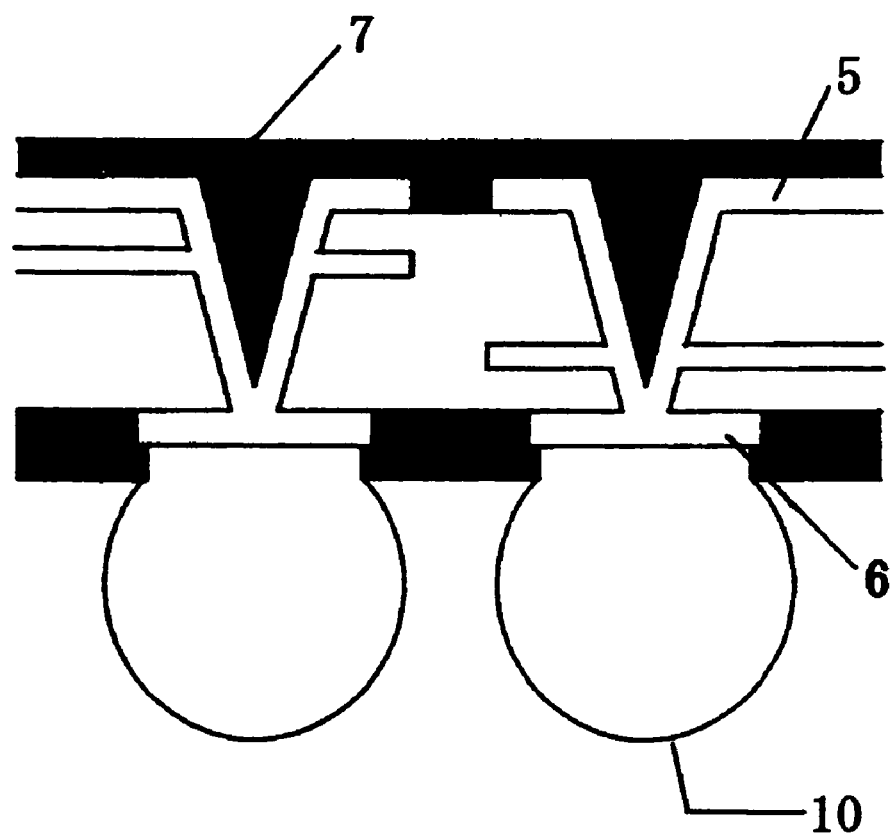
FIG. 5 is an explanatory drawing showing a printed wiring board of the present invention, in which taper-shaped through holes made in a four-layer board are filled with a solder resist and ball pads and solder balls are mounted on small-diameter side ends.
Figure 6:
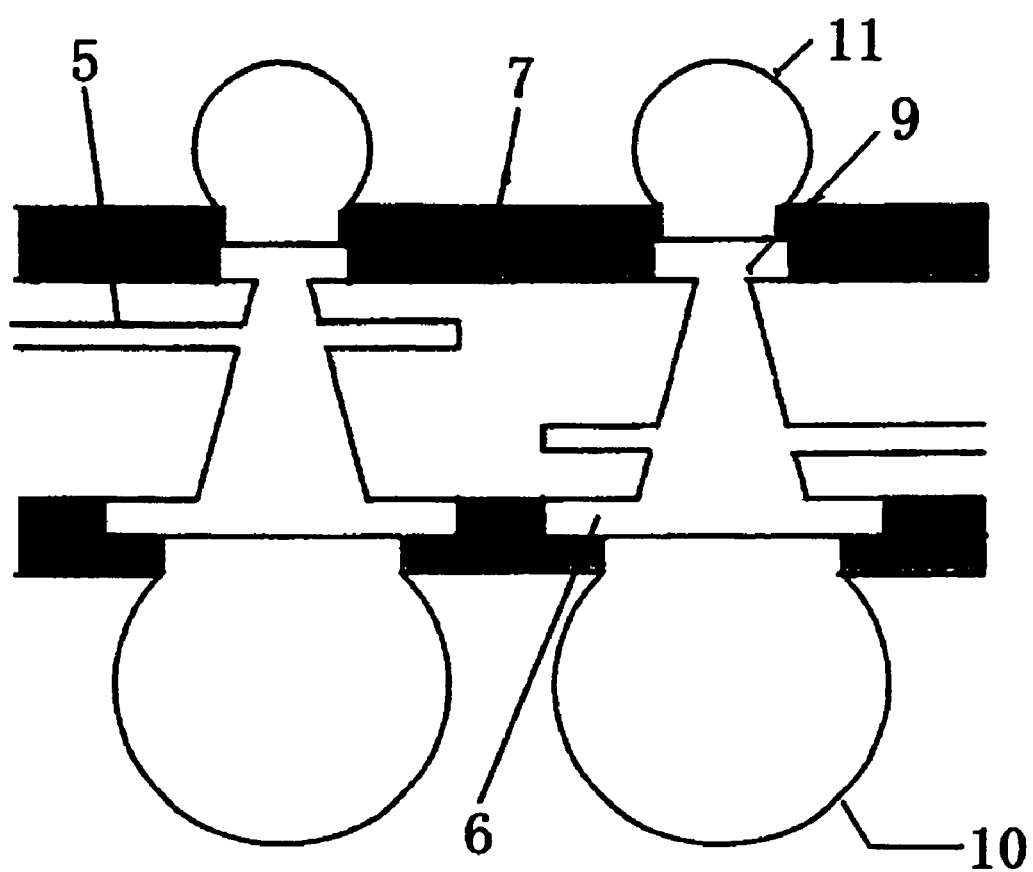
FIG. 6 is an explanatory drawing showing a printed wiring board of the present invention, in which taper-shaped through holes made in a four-layer board are filled by plating and solder balls and solder precoats are mounted on pads formed on both side ends.

A variety of embodiments of the present invention will be explained with reference to FIG. 2 to FIG. 6 hereinafter. FIG. 2 shows an example in which a taper-shaped through hole is filled by plating in the plating step of FIG. 1 (D), a bump pad 9 is formed at the small-diameter side end and a ball pad 6 is formed at the large-diameter side end. FIG. 3 shows an embodiment in which a solder ball 10 is mounted on a ball pad 6 at the small-diameter side end of a printed wiring board produced by the step of FIG. 1 (F). FIG. 4 shows an embodiment in which a solder precoat 11 is mounted on the bump pad 9 (upper surface) formed at the small-diameter side end of the printed wiring board of FIG. 2 and a solder pad 10 is mounted on the ball pad 6 (lower surface) at the large-diameter side end. FIG. 5 shows an embodiment in which a taper-shaped through hole made in a four-layered board is filled with a solder resist 7 and a solder ball 10 is mounted on a ball pad 6 formed at the small-diameter side end. FIG. 6 shows an embodiment in which a taper-shaped through hole made in a four-layered board is filled by plating and a solder precoat 11 is mounted on a bump pad 9 at the small-diameter side end and a solder ball 10 is mounted on a ball pad 6 at the large-diameter side end.

The thus-obtained printed wiring boards are able to be more densified as a package for mounting a semiconductor, so that they have advantages that more terminals can be disposed when an area is the same or an area can be decreased when the number of terminals is the same.

Figure 7:
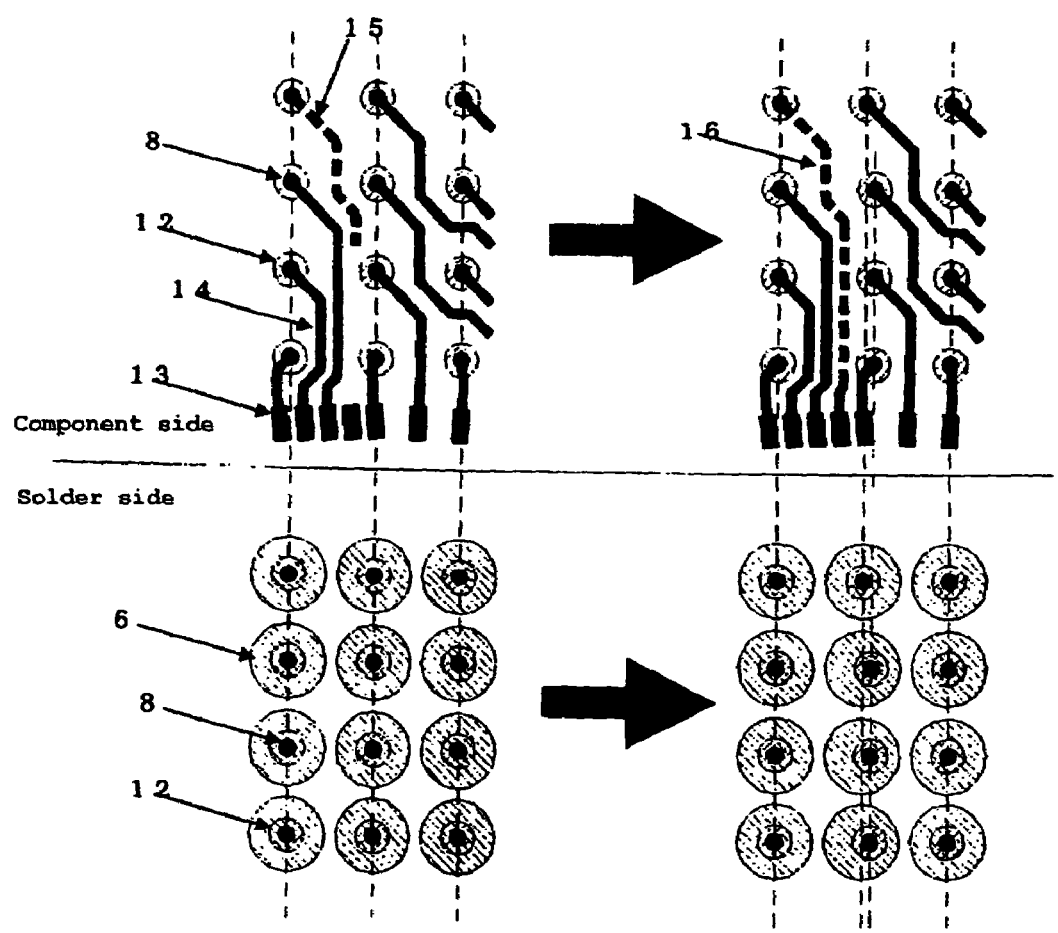
FIG. 7 is an explanatory drawing showing the wiring state of a printed wiring board having taper-shaped through holes of which the center positions are one-sided from the arrangement of the center positions of other taper-shaped through holes and taper-shaped through holes of which the center positions are not one-sided.
Figure 8:
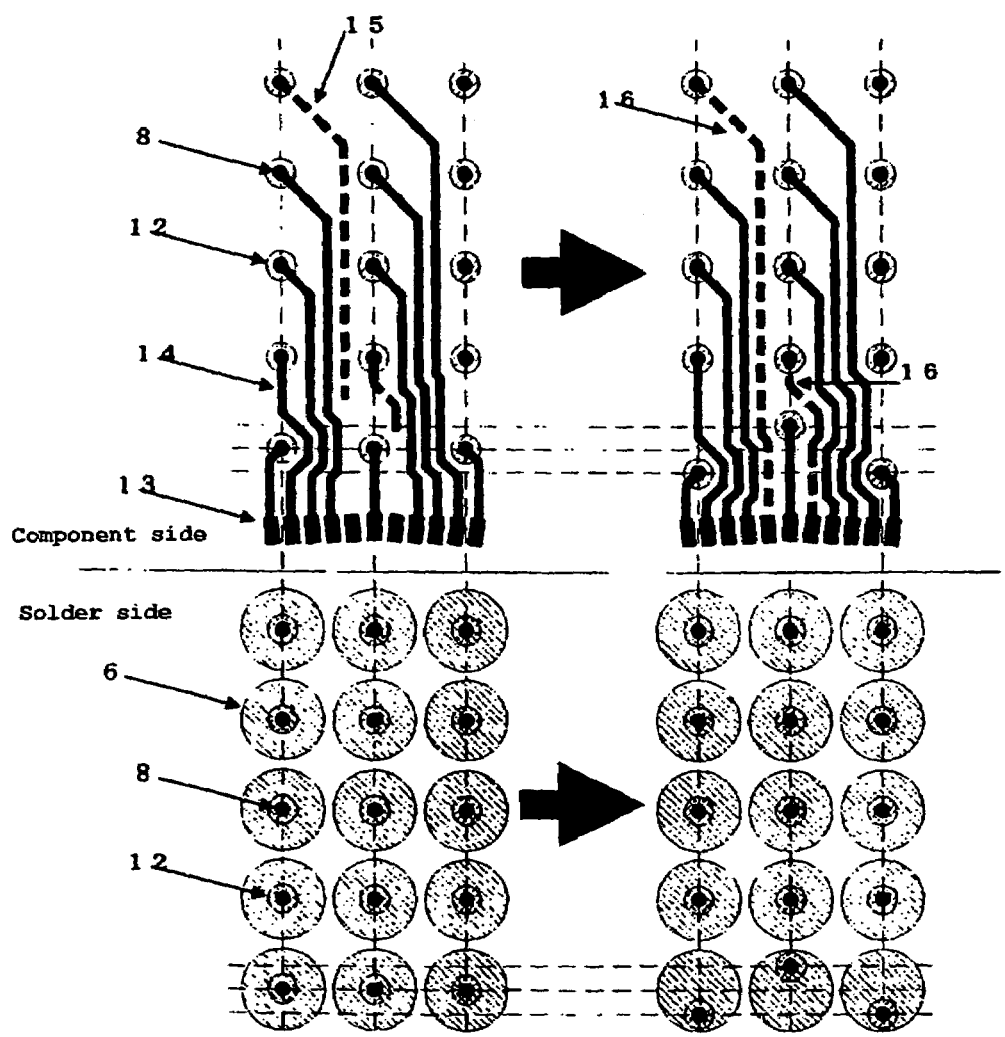
FIG. 8 is an explanatory drawing showing the wiring state of a printed wiring board having taper-shaped through holes of which the center positions are one-sided from the arrangement of the center positions of other taper-shaped through holes and taper-shaped through holes of which the center positions are not one-sided.
Figure 9:
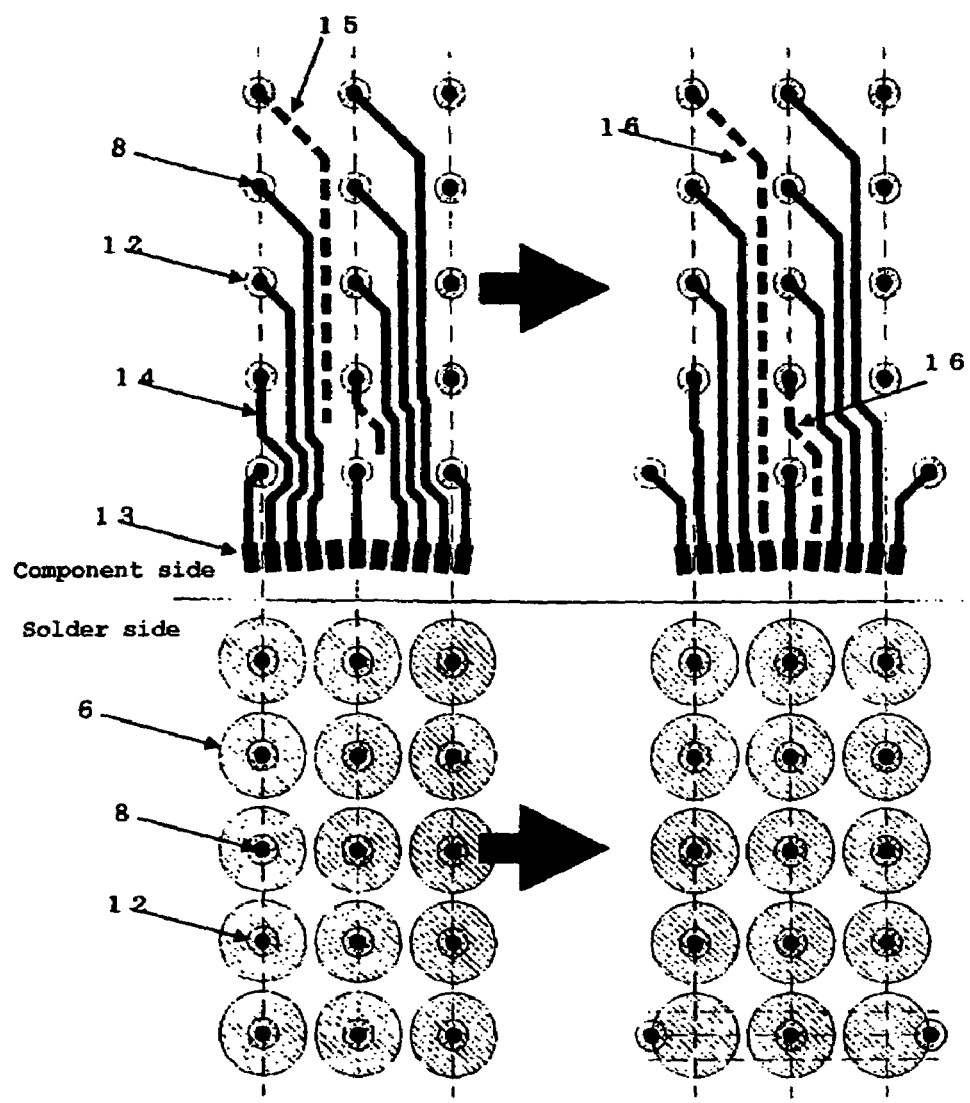
FIG. 9 is an explanatory drawing showing the wiring state of a printed wiring board having taper-shaped through holes of which the center positions are one-sided from the arrangement of the center positions of other taper-shaped through holes and taper-shaped through holes of which the center positions are not one-sided.

In the present invention, the center position of a specific taper-shaped through hole of taper-shaped through holes is not disposed at the center of a ball pad or a bump pad, but it is disposed one-sidedly from the center positions of the other taper-shaped through holes in file and/or row direction(s) (note that, in the Figures, files extend in the side-to-side direction, and rows extend in the up-and-down direction). FIG. 7 shows an embodiment in which ball pads are formed at the small-diameter side end and the ball pads are disposed in four files (four lines counted from the top). As shown in FIG. 7, the center positions (axes) of specific taper-shaped through holes disposed in the center row are one-sided (i.e., offset from the center axes of the corresponding ball pads) in the right direction (right figure of FIG. 7). The above one-sided disposition can widen a spacing of a specific through hole land (12) on the large-diameter side (component side in FIG. 7) and, as a result, the number of wirings locatable at the above space can be increased. In many cases, to increase the number of wirings is not required in all through hole land spacings but is required in a specific through hole land spacing. In such cases, the present invention is effective. The above spacing increase utilizes that the diameter of the small-diameter side of a taper-shaped through hole is small. FIG. 8 shows an embodiment in which ball pads are formed at the small-diameter side ends and the ball pads are disposed in five files. This embodiment is an example in which the center positions of the through holes in the first file from the bond pad side are one-sided in a direction toward the bond pad side and to the opposite direction (right figure of FIG. 8), which actualizes an increase in the number of wirings on the component side (on the large-diameter side). The offset distance of the center position of the taper-shaped through hole is generally such that the center position is within a ball pad or a bump pad. However, even when the center position is disposed outside the pad, the effect of the present invention can be obtained if the center position is located at 100 μm or less outside from the pad end. FIG. 9 shows embodiments in which ball pads are disposed in five files. The right figure of FIG. 9 shows an example in which the center position is offset by 100 μm or less. When the offset distance exceeds 100 μm, it is required to separately dispose a through hole land. In this case, it is impossible to achieve a high-density wiring in a specific portion, which is the object of the present invention. In FIG. 7, FIG. 8 and FIG. 9, the right figure of FIG. 7, for example, means a figure drawn on the right as one faces the paper.

The embodiments shown in FIGS. 7-9 are explained with reference to examples more in detail. FIG. 7 shows embodiments of a chip scale package (CSP) having a line/space=40/40 μm, a bond pad width/space=75/35 μm, a ball pad diameter of 350 μm, four ball pad files, a ball pad pitch of 400 μm and a through hole land diameter of 160 μm, wherein the large-diameter side end diameter is 80 μm and the small-diameter side end diameter is 20 μm. In the left figure of FIG. 7 showing a general embodiment, there is a wiring 15 which can not secure a wiring connecting a bond pad 13, as a junction with IC, to a through hole 8. In the right figure of FIG. 7 being an embodiment of the present invention, the center positions of through holes 8 in the center portion are one-sided with regard to the center position of the other through hole 8, as shown in the figure, thereby actualizing a wiring 16 in the same line/space rule.

FIG. 8 shows embodiments of a chip scale package (CSP) having a line/space=40/40 μm, a bond pad width/space=75/35 μm, a ball pad diameter of 350 μm, five ball pad files, a ball pad pitch of 500 μm and a through hole land diameter of 160 μm, wherein the large-diameter side end diameter is 80 μm and the small-diameter side end diameter is 20 μm. In the left figure of FIG. 8 showing a general embodiment, there is a wiring 15 which can not connect a bond pad 13 to a through hole 8. In the right figure of FIG. 8 showing an embodiment of the present invention, the center positions of three through holes positioned nearest to the bond pads 13 side are one-sided as shown in the figure, thereby actualizing a wiring 16 in the same line/space rule.

FIG. 9 shows embodiments of a chip scale package (CSP) having a line/space=40/40 μm, a bond pad width/space=75/35 μm, a ball pad diameter of 450 μm, five ball pad files, a ball pad pitch of 500 μm and a through hole land diameter of 160 μm, wherein the large-diameter side end diameter is 80 μm and the small-diameter side end diameter is 20 μm. In the left figure of FIG. 9 showing a general embodiment, there is a wiring 15 which can not connect a bond pad 13 to a through hole 8. In the right figure of FIG. 9 showing an embodiment of the present invention, the center positions of through holes positioned nearest to bond pads are one-sided as shown in the figure, thereby actualizing a wiring 16 in the same line/space rule.

The present invention has been explained mainly with regard to a double-side substrate, while a similar design can be actualized with regard to a multilayer substrate. Further, a similar design can be also actualized with regard to flip chip in place of wire bonding, and densification is possible.

In the present invention 2, a produced printed wiring board can be more densified as a package for mounting a semiconductor, so that it has advantages that more terminals can be disposed when an area is the same or an area can be decreased when the number of terminals is the same.

EFFECT OF THE INVENTION

There can be provided a high-densified printed wiring board for mounting a semiconductor by making a taper-shaped through hole of which a side end is sealed and forming a bump pad or a ball pad on the side end of the through hole.

In a high-density printed wiring board for mounting a semiconductor provided by making taper-shaped through holes of which side ends are sealed and forming bump pads or ball pads on the side ends of the through holes, the center position of a specific taper-shaped through hole of the above taper-shaped through holes is not positioned at the center of the ball pad or bump pad and is disposed one-sidedly in file and/or row direction(s) from the arrangement of the center positions of the other taper-shaped through holes. The above one-sided disposition of the specific taper-shaped through hole broadens a specific land spacing on the large-diameter side end side of the taper-shaped through hole and increases the number of wirings locatable at the above space, whereby there is provided a higher-densified printed wiring board for mounting a semiconductor.

EXAMPLES

The present invention will be explained more in detail with reference to Examples hereinafter.

Example 1

A BT (bismaleimide triazine resin) double-side copper-clad laminate ("CCL-HL832HS", supplied by Mitsubishi Gas Chemical Company, Inc.) having 3-μm thick copper foils on both surfaces and a 100-μm thick glass fabric inserted therein was used as a laminate. A backup sheet ("LSB-90", supplied by Mitsubishi Gas Chemical Company, Inc.) made of an aluminum foil was bonded to a lower surface of the laminate, and then taper-shaped penetration holes were made in the laminate with an UV laser ("YB-HYS401T01", supplied by Matsushita Industrial Information Equipment Co., Ltd.). Table 1 shows UV laser processing conditions. The cross-sectional shape of the taper-shaped penetration holes obtained was a conical shape having a small-diameter side end of 20 μm and a large-diameter side end of 80 μm. Then, copper plating was carried out by electroless plating and electroplating. By controlling an electric current density (5A/dm$^2$ substrate) during the electroplating, an inner wall surface of each taper-shaped through hole was plated to form a copper layer and simultaneously the small-diameter side end thereof was sealed by the plating to connect the copper foils on the upper and lower surfaces to each other, whereby taper-shaped through holes were obtained. The thickness of the plating was 15 to 28 μm in the through holes. The cross section thereof was checked. As a result, it was found that the small diameter side ends of the copper-plated taper-shaped through holes were sealed by the copper plating. After the completion of the plating, a pattern formation on both the external surfaces was carried out by a general subtractive method, that is, by using a dry film etching resist and carrying out etching. In the pattern formation, a pattern arrangement was selected such that the small-diameter side ends of the taper-shaped through holes became ball pads. Then, a solder resist ("PSR4000AUS308, supplied by TAIYO INKMFG. CO., LTD.) was applied and dried, and patterns were formed. Finger pad portions on the upper side (component side) and ball pad portions (shape of a solder mask define SMD) on the lower side (ball side) were made to be openings. Then, final curing was carried out. Then, electrolytic nickel/gold plating was carried out through a plating lead to plate the surfaces of the finger pads and the ball pads with gold (See FIG. 1).

TABLE 1

UV laser processing conditions (per hole)

| Step | Energy μJ/pulse | Diameter of processing track μm | Processing pitch on track μm | Number of shots | Total energy μJ |
|---|---|---|---|---|---|
| 1 | 100 | 30 | 12 | 9 | 900 |
| 2 | 100 | 64 | 8 | 27 | 2,700 |
| 3 | 160 | 55 | 18 | 11 | 1,760 |

TABLE 1-continued

UV laser processing conditions (per hole)

| Step | Energy μJ/pulse | Diameter of processing track μm | Processing pitch on track μm | Number of shots | Total energy μJ |
|---|---|---|---|---|---|
| 4 | 130 | 50 | 15 | 11 | 1,430 |
| 5 | 130 | 40 | 15 | 9 | 1,170 |
| 6 | 130 | 30 | 15 | 7 | 910 |
| 7 | 160 | 4 | 2 | 7 | 1,120 |
| 8 | 160 | 4 | 2 | 7 | 1,120 |

Example 2

An epoxy double-side copper-clad laminate ("E679FB", supplied by Hitachi Chemical Co., Ltd.) having 12-μm thick copper foils on both surfaces and a 100-μm thick glass fabric inserted therein was used as a laminate. The laminate was treated with a hydrogen peroxide/sulfuric acid type soft etching agent ("CPE900", supplied by Mitsubishi Gas Chemical Company, Inc.), to decrease the thickness of the copper foils on the external layers to 5 μm. Then, taper-shaped through holes were made in the laminate with a UV laser ("YB-HYS401T01, supplied by Matsushita Industrial Information Equipment Co., Ltd.). The UV processing conditions were the same as those in Example 1.

Then, pattern plating was carried out. That is, after electroless copper plating, dry film plating resists were disposed on both surfaces of the laminate. The dry films in pattern portions and through hole portions (including ball pads and bump pads) which portions were required to be plated, were removed, and then electroplating was carried out. The above electroplating used a pulsed current, and the through holes were filled by the plating. Then, the dry films were peeled off and then the entire surface was etched with a soft etching solution, to remove the base copper layers and to leave patterns. As a pattern of the pattern plating, bump pads were formed at the through hole small-diameter side ends and ball pads were formed at the large-diameter side ends. After the completion of the pattern plating, a solder resist ("PSR4000AUS308, supplied by TAIYO INK MFG. CO., LTD.) was formed by a general method such that the bump pads and the ball pads became openings. Then, the openings were treated by an organic rust prevention treatment ("GLICOAT-SMD [F2(LX)]", supplied by SHIKOKU CORPORATION) (see FIG. 2).

Example 3

A chip size package (CSP) substrate having a design shown in the right figure of FIG. 7, as an arrangement of a pattern, and taper-shaped through holes was prepared as follows.

A BT (bismaleimide triazine resin) double-side copper-clad laminate ("CCL-HL832HS" supplied by Mitsubishi Gas Chemical Company, Inc.) having 3-μm thick copper foils on both surfaces and a 100-μm thick glass fabric inserted therein was used as a laminate. A backup sheet ("LSB-90", supplied by Mitsubishi Gas Chemical Company, Inc.) made of an aluminum foil was bonded to a lower surface of the laminate, and then taper-shaped penetration holes were made in the laminate with an UV laser ("YB-HYS401T01", supplied by Matsushita Industrial Information Equipment Co., Ltd.). Table 2 shows UV laser processing conditions. The cross-sectional shape of the taper-shaped penetration holes obtained was a conical shape having a small-diameter side end of 20 μm and a large-diameter side end of 80 μm. Then, copper plating was carried out by electroless plating and electroplating. By controlling an electric current density (5A/dm² substrate) during the electroplating, an inner wall surface of each taper-shaped through hole was plated to form a copper layer and simultaneously the small-diameter side end thereof was sealed by the plating to connect the copper foils on the upper and lower surfaces to each other, whereby taper-shaped through holes were obtained. The thickness of the plating was 15 to 28 μm in the through holes. The cross section thereof was checked. As a result, it was found that the small diameter side ends of the copper-plated taper-shaped through holes were sealed by the copper plating. After the completion of the plating, a pattern formation on both the external surfaces was carried out by a general subtractive method, that is, by using a dry film etching resist and carrying out etching. In the pattern formation, according to the above design, there was adopted a pattern arrangement in which the small-diameter side ends of some of the taper-shaped through holes were located within ball pads respectively but the above small-diameter side ends were not located in the centers of the ball pads. Then, a solder resist ("PSR4000AUS308, supplied by TAIYO INK MFG. CO., LTD.) was applied and dried, and patterns were formed. Bond pad portions on the upper side (component side) and ball pad portions (shape of a solder mask define SMD) on the lower side (ball side) were made to be openings. Then, final curing was carried out. Then, electrolytic nickel/gold plating was carried out through a plating lead to plate the surfaces of the bond pads and the ball pads with gold (See FIG. 1).

TABLE 2

UV laser processing conditions (per hole)

| Step | Energy μJ/pulse | Diameter of processing track μm | Processing pitch on track μm | Number of shots | Total energy μJ |
|---|---|---|---|---|---|
| 1 | 100 | 30 | 12 | 9 | 900 |
| 2 | 100 | 64 | 8 | 27 | 2,700 |
| 3 | 160 | 55 | 18 | 11 | 1,760 |
| 4 | 130 | 50 | 15 | 11 | 1,430 |
| 5 | 130 | 40 | 15 | 9 | 1,170 |
| 6 | 130 | 30 | 15 | 7 | 910 |
| 7 | 160 | 4 | 2 | 7 | 1,120 |
| 8 | 160 | 4 | 2 | 7 | 1,120 |

The taper-shaped through holes having sealed ends were made and the center positions of some of the through holes were one-sided from the center of corresponding pads, whereby there was provided a printed wiring board for mounting a semiconductor, of which the number of wirings was increased, i.e., which was high-densified.

What is claimed is:

1. A method of forming a high density printed wiring board for mounting a semiconductor, said method comprising:
    providing a substrate having upper and lower surfaces, with an upper conductive layer on the upper surface and a lower conductive layer on the lower surface;
    forming a plurality of taper-shaped passages through the substrate and the upper and lower conductive layers, each of the taper-shaped passages having a center axis, an internal wall surface, a small-diameter end having an opening diameter of 10-50 μm, and a large-diameter end having an opening diameter that is greater than the opening diameter of the small-diameter end and 100 μm or less;
    applying a metallic plating in each of the taper-shaped passages so as to plate the internal wall surfaces and seal the small-diameter ends in a manner so as to form a plurality of taper-shaped, electrically conductive through holes having a center axis, a small-diameter end, and a large-diameter end; and
    providing at least one of the through holes with a connection pad having a center axis, such that the connection pad is provided at least one of the small-diameter end and the large-diameter end of the through hole, and the center axis of the through hole is within 100 μm of a peripheral edge of the connection pad, but offset from the center axis of said connection pad.

2. The method of claim 1, wherein said providing at least one of the through holes with a connection pad comprises providing a connection pad at least one of the small-diameter end and the large-diameter end of each of a plurality of the through holes.

3. The method of claim 1, wherein in said providing at least one of the through holes with a connection pad, at least one of a bump pad and a ball pad is provided.

4. The method of claim 2, wherein in said providing at least one of the through holes with a connection pad, at least one of a bump pad and a ball pad is provided.

* * * * *